United States Patent [19]
Perry et al.

[11] Patent Number: 4,881,908
[45] Date of Patent: Nov. 21, 1989

[54] HIGH DENSITY AND HIGH SIGNAL INTEGRITY CONNECTOR

[75] Inventors: Michael Perry, Mountain View; Gary Yasumura, Santa Clara, both of Calif.

[73] Assignee: Beta Phase, Inc., Menlo Park, Calif.

[21] Appl. No.: 255,500

[22] Filed: Oct. 11, 1988

[51] Int. Cl.⁴ .......................................... H01R 13/24
[52] U.S. Cl. ................................................... 439/161
[58] Field of Search ................... 439/161, 67, 77, 492, 439/493, 592

[56] References Cited

U.S. PATENT DOCUMENTS

| | | | |
|---|---|---|---|
| 3,319,216 | 5/1967 | McCollough | 439/493 |
| 3,569,901 | 3/1971 | Connor | 439/161 |
| 3,740,839 | 6/1973 | Otte et al. | 439/161 |
| 3,913,444 | 10/1975 | Otte | 439/161 X |
| 4,080,027 | 3/1978 | Benasutti | 439/67 X |
| 4,116,516 | 9/1978 | Griffin | 439/67 |
| 4,487,465 | 12/1984 | Cherian | 439/161 |
| 4,587,596 | 5/1986 | Bunnell | 439/493 |
| 4,621,882 | 11/1986 | Krumme | 439/161 |
| 4,643,500 | 2/1987 | Krumme | 439/161 |

FOREIGN PATENT DOCUMENTS

| | | | |
|---|---|---|---|
| 260132 | 3/1988 | European Pat. Off. | 439/161 |
| 2554977 | 5/1985 | France | 439/77 |
| 53288 | 4/1979 | Japan | 439/161 |

*Primary Examiner*—William Briggs
*Attorney, Agent, or Firm*—Burns, Doane, Swecker & Mathis

[57] ABSTRACT

A high-performance, multi-row contact matrix electrical connector having a spring element in the form of an elongated hollow split tube with a heat-recoverable member of shape-memory alloy positioned within the tube and including first and second sets of parallel spaced conductors terminating at least at one end thereof in a first and second matrix of contact pads, the matrices and the pads being positioned within the split, a change in temperature changing the shape-memory alloy from one metallurgical state to another, causing movement of the heat-recoverable member and the spring means to open and close the connector.

20 Claims, 5 Drawing Sheets

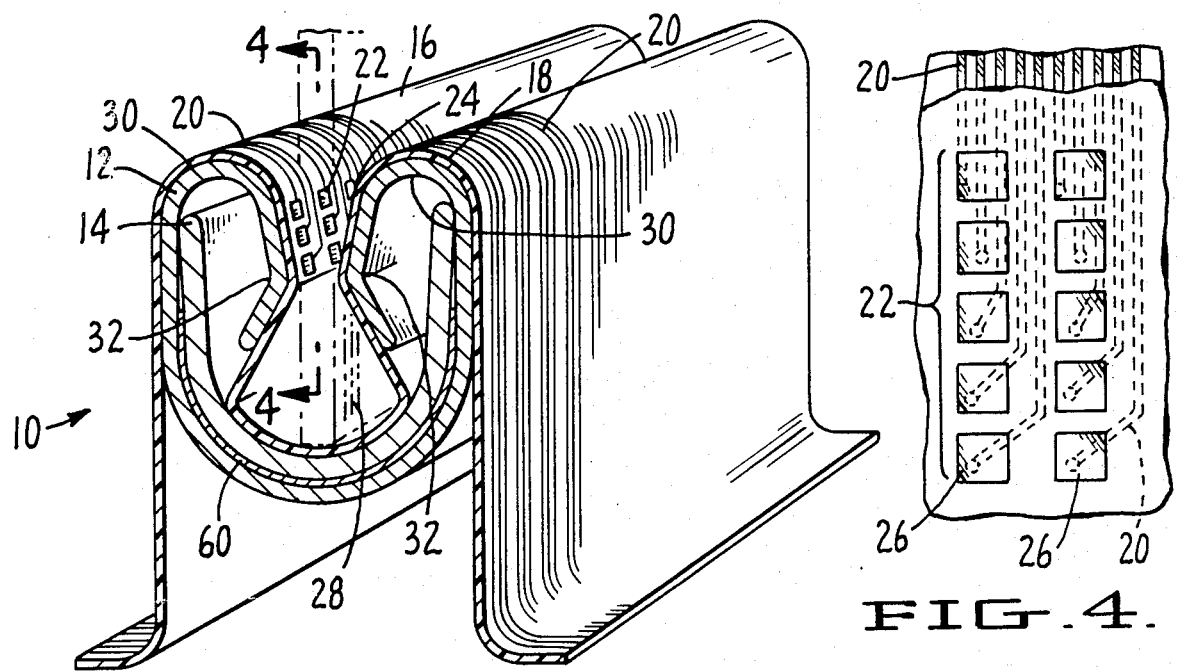
FIG.1.
FIG.4.
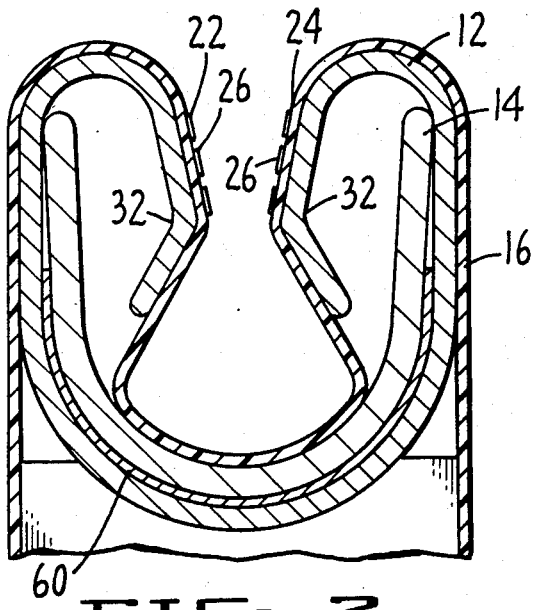
FIG.2.
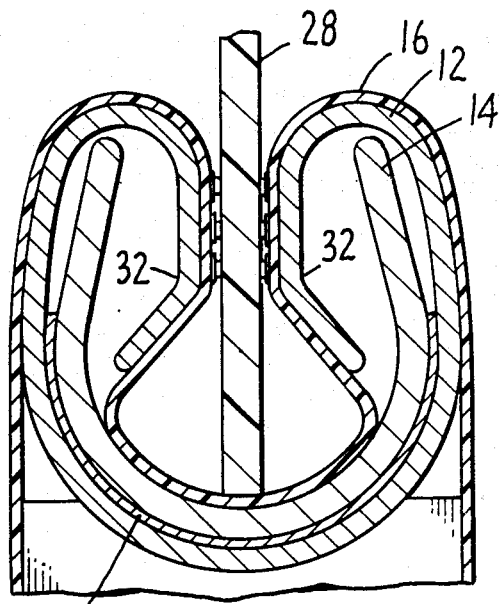
FIG.3.
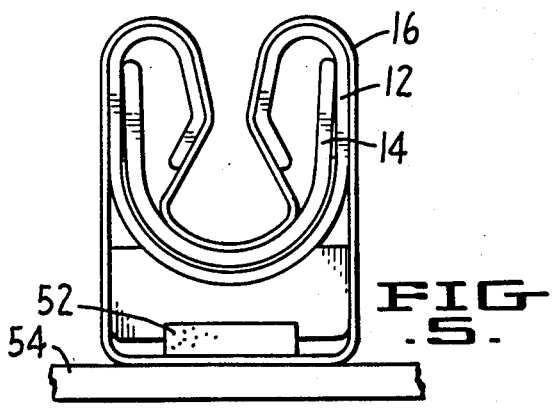
FIG.5.
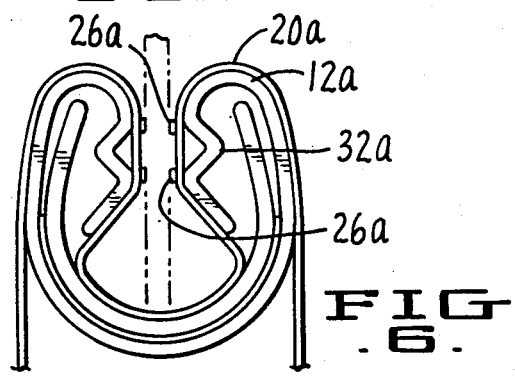
FIG.6.

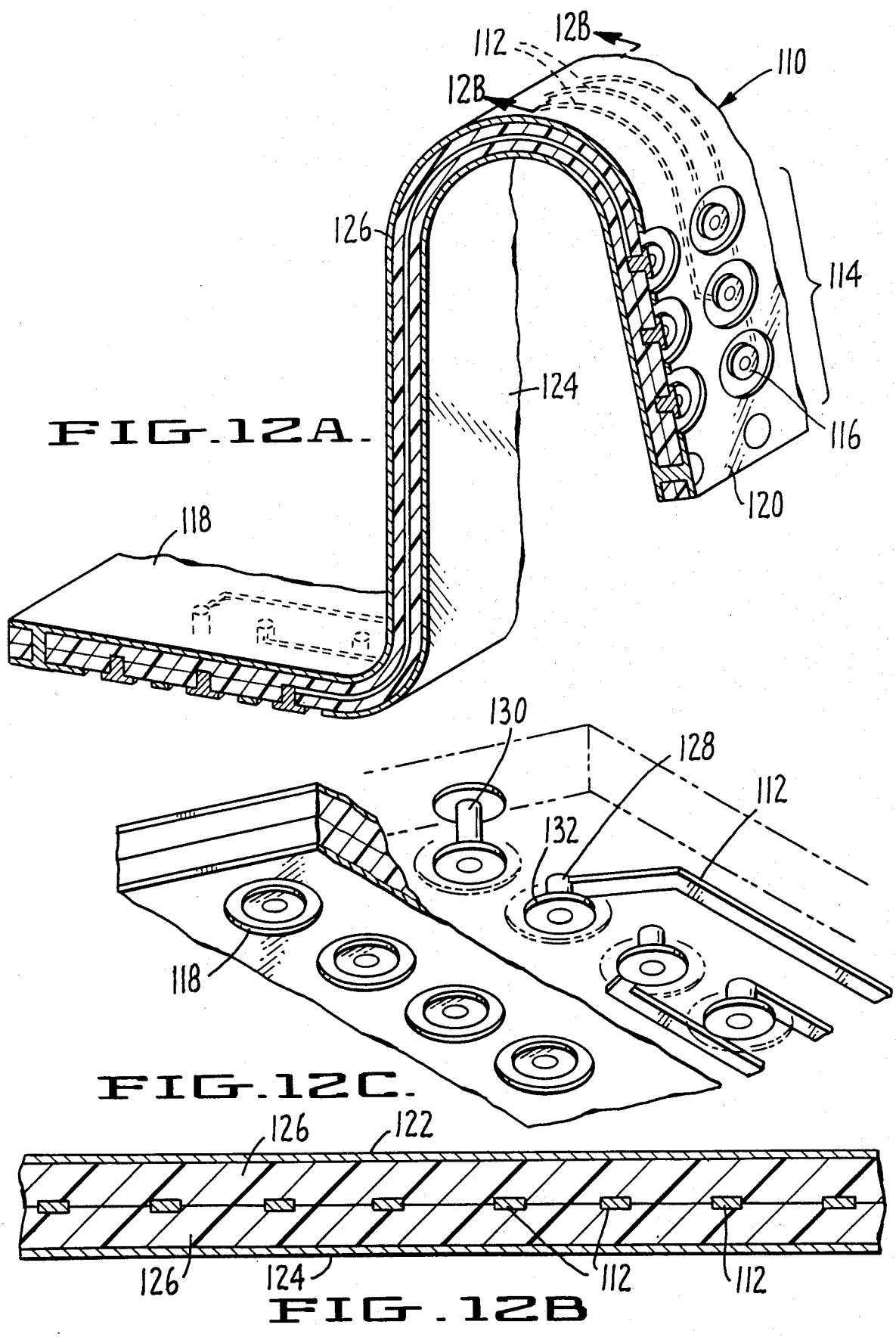

HIGH DENSITY AND HIGH SIGNAL INTEGRITY CONNECTOR

BACKGROUND OF THE INVENTION

1. Field of the Invention

The invention relates to electrical connectors and more particularly to multi-contact, multi-row zero insertion force connectors using shape-memory alloys to actuate the connector.

2. Prior Art

In the past, a thermally responsive electrical connector has been developed which provides a zero insertion force coupling for connecting two electrical components wherein a plurality of parallel conductors along one component are connected with corresponding conductors along the other component. Such a connector is disclosed in commonly-assigned U.S. Pat. No. 4,621,882 to Krumme. The patent discloses the combination of a heat-recoverable member of shape-memory alloy and a spring means which are components of an elongated hollow split tube, the connector further including a plurality of parallel spaced conductors which wrap around the tube and extend within the split of the hollow tube, opening and closing of the split causing the conductors to contact a substrate that may be inserted within the confines of the tube, the substrate having identically spaced conductors.

Although the above-mentioned conductor is a breakthrough in the connector field, it would further be desirable to have a thermally responsive zero insertion force electrical connector capable of a high density (e.g., 100 to 250 conductor lines per inch) of interconnections wherein the density of conductors is not limited to a single row of contact points. It would also be desirable to have a connector wherein the conductors are electrically isolated one from the other in sophisticated flexible circuitry to produce a high-performance connector capable of passing high-frequency signals with minimum distortions. It would further be desirable to have a connector wherein the closing of the connector may produce a wiping action between the connector and the substrate to be connected in order to remove contamination that may exist at the points of contact. The present invention provides such a connector and is an improvement and an enhancement to connectors previously known.

SUMMARY OF THE INVENTION

The purpose of the subject invention is to provide a high density and high signal integrity connector having a minimum number of components to provide a zero insertion force high-density interconnection with optional wiping motion.

To accomplish this purpose, there is provided a high-performance connector having a spring means in the form of an elongated hollow split tube, a heat-recoverable member of shape-memory alloy concentrically positioned within the spring means being biased by the spring means and including sets of parallel conductors, each set terminating at one end of each set thereof in a first and a second matrix of contact pads wherein the contact pads of each matrix are spaced from each other in that matrix in two dimensions, the matrices being positioned within the split of the spring means so as to provide multi-row contact. In addition, there is provided a spring means which may include arm portions extending inwardly toward the axis of the split tube, the matrices being positioned adjacent the arms, closing of the connector causing a wiping motion between the contact pads and the pads of a substrate that is to be interconnected.

In one aspect of the invention there is disclosed a high-performance connector comprising:

spring means, said spring means being an elongated hollow split tube having a longitudinal axis and an axially aligned split defining a generally C-shaped cross-section with end portions;

a heat-recoverable member, said heat-recoverable member being elongated and generally C-shaped and being concentrically positioned within the cross-section of said spring means and being biased by said spring means, said heat-recoverable member formed from shape-memory alloy having a deformable state below a transition temperature and a memory state above the transition temperature, said heat-recoverable member capable of being deformed by said spring means when said alloy is in its deformable state corresponding to one dimension of said split, a change from its deformable state to its memory state recovering said member to its non-deformed shape corresponding to another dimension of said split; and first and second sets of parallel spaced conductors, each set terminating at one end of each set thereof in a first and a second matrix of contact pads, respectively, the contact pads of each matrix being spaced from each other in that matrix in two dimensions, said first and second sets of conductors at least partially surrounding said spring means and said matrices being positioned within the split of said spring means adjacent the end portions of said spring means, pads of the first matrix being positioned on one side of the split and the pads of the second matrix being positioned generally opposite thereto on the other side of the split, movement of said spring means causing the plurality of pads on each matrix to move toward each other to contact and electrically connect with a substrate that may be inserted within said split.

For a better understanding of the invention, various embodiments will now be described by way of example with reference to the accompanying drawing.

DESCRIPTION OF THE DRAWING

FIG. 1 is a perspective view of the high-performance connector of the invention with a portion of a substrate in the form of a daughter board (shown in phantom) inserted therein.

FIG. 2 is a partial cross-sectional view of the connector of FIG. 1 with the connector in its open position.

FIG. 3 is a partial section view similar to FIG. 2 with the connector in its closed position about a daughter board.

FIG. 4 is a view taken along direction line 4—4 in FIG. 1 illustrating the conductor contact pads of one matrix wherein individual conductors of a multi-layered flexible circuitry are shown in phantom.

FIG. 5 is an alternate embodiment of a high-performance connector wherein the first and second sets of parallel spaced conductors wrap around the connector, the connector including means to interconnect the connector with a mother board.

FIG. 6 is another embodiment of a high-performance connector with alternate spring means to concentrate force onto contact pads.

FIGS. 9A-D are views of one set of parallel spaced conductors used in the connectors shown in FIGS. 1-7 wherein the conductors are in the form of co-planar flexible circuitry wherein:

FIG. 9A is a partial perspective view similar to FIG. 1 of one set of conductors positioned as they would be positioned as part of the connector and above a substrate in the form of a mother board portion (shown in phantom);

FIG. 9B is a partial cross-sectional view taken along section line 9B—9B in FIG. 9A showing a standard electrical arrangement of signal conductors in the left portion of the Figure and alternatively an arrangement for enhanced high speed signal integrity with alternating signal and ground conductors in the right portion of the Figure;

FIG. 9C is a partial perspective view of the mother board portion of the set of conductors shown in FIG. 9A; and FIG. 9D is a partial perspective view of the daughter board portion of the set of conductor shown in FIG. 9A.

FIGS. 11A-E are views of one set of parallel spaced conductors used in the connectors shown in FIGS. 1-7 wherein the conductors are in the form of a co-planar with ground plane flexible circuitry wherein:

FIG. 11A is a partial perspective view of one set of parallel spaced conductors similar to that illustrated in FIG. 9A positioned in a connector configuration, one portion thereof positioned over a substrate in the form of a mother board (shown in phantom);

FIG. 11B is a partial cross-sectional view taken along section line 11B—11B in FIG. 11A, the left side of the Figure illustrating an arrangement of electrical conductors defined as micro-strip flexible circuitry, and the right side of the Figure illustrating an arrangement of electrical conductors defined as a co-planar alternating signal ground with ground plane flexible circuitry;

FIG. 11C is a partial cross-sectional view of the mother board portion of the set of parallel spaced conductors as shown in FIG. 11A, the Figure illustrating the through-hole type means of interconnecting conductors to a mother board (not shown) and connecting the ground plane to a mother board;

FIG. 11D illustrates the daughter board portion of the set of parallel spaced conductors shown in FIG. 11A and showing the through-hole type interconnection of the ground plane and the surface conductors; and FIG. 11E illustrates an alternate embodiment of a set of parallel spaced conductors wherein the set is used in a connector configuration similar to FIGS. 5 and 8 wherein throughhole connections are used to interconnect the ground plane in both the daughter board and mother board portions of the connector.

FIGS. 12A-C are views of one set of parallel spaced conductors used in the connector shown in FIGS. 1-7 wherein the conductors are sandwiched between two ground planes, the arrangement of conductors defined as strip-line flexible circuitry wherein:

FIG. 12A is a partial perspective view of one set of parallel spaced conductors positioned similar to the positioning of such a set in FIG. 1;

FIG. 12B is a partial cross-sectional view taken along section line 12B—12B in FIG. 12A; and FIG. 12C is a partial perspective view of the mother board portion or the daughter board portion of the parallel spaced conductors illustrating the through-hole type contact of the conductors and the ground planes.

DESCRIPTION OF THE PREFERRED EMBODIMENTS

Figure 8:
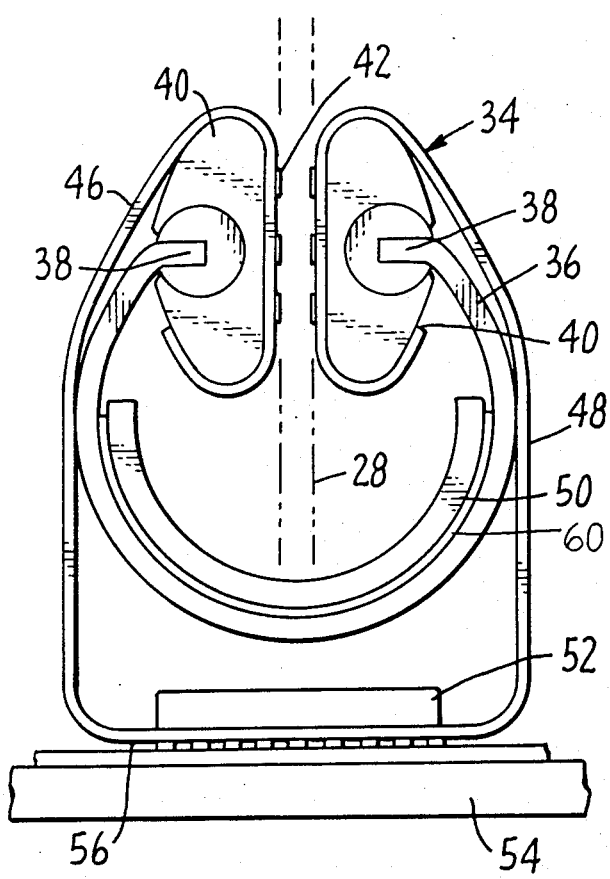
FIG. 8 is yet another embodiment of a high-performance connector illustrating pressure pads connected to the end portions of the spring means to uniformly support the first and second matrices of the contact pads.

With continued reference to the drawing, FIG. 1 illustrates a high-performance connector (shown generally at 10) comprising spring means 12, heat-recoverable means 14, and first and second sets 16 and 18 of parallel spaced conductors 20. It can be seen that the first and second sets 16 and 18 of parallel spaced conductors at one end of each set terminate in a first matrix 22 and a second matrix 24 of contact pads 26, the matrices and the contact pads being positioned opposite each other between the ends of the spring means 12 and the heat-recoverable means 14 to contact a substrate 28 (shown in phantom) that may be inserted within the connector 10. Although the substrate is shown to be a portion of a daughter board, it is understood that any substrate having mating contacts is within the scope of the invention.

FIGS. 2 and 3 illustrate the operation and further detail of the connector shown in FIG. 1. FIG. 4 illustrates a set of parallel spaced conductors 20 terminating in a matrix 22 of contact pads 26, the contact pads of the matrix being spaced from each other in that matrix in two dimensions. The matrix concept provides a major improvement over prior concepts and is the breakthrough referred to as the "multi-row" connector concept. The parallel spaced conductors 20 are on one layer separated from the contact pads 26 by a dielectric material. Conduction is made between the conductors 20 and the contact pads 26 by through-hole type contact of the conductors and pads. FIG. 4, therefore, illustrates a multi-layered flexible circuitry construction. It can be seen by comparing FIG. 2 with FIG. 3 that the matrices 22 and 24 (which may also be defined as the daughter board portions of the respective sets 20 of conductors) are positioned on opposite sides of the connector. Closing movement of the connector will cause the plurality of pads on each matrix to move toward each other to contact and electrically interconnect with a substrate such as a daughter board that may be inserted between the matrices 22 and 24. FIG. 3 illustrates the connector in such a closed position in contact with substrate 28 having complementary matrices.

The multi-row/matrix concept allows a very fine pitch (e.g., 100 conductors or more per inch similar to that illustrated) for the set of parallel spaced conductors 20 to terminate in a two-dimensional matrix such as matrix 22. The contact pad size is much larger than the width of the conductors and may be on a centerline spacing larger than that of the conductors. Therefore, the actual alignment of contact pads 26 to a substrate is based upon the matrix density and not the trace density, thus greatly increasing the connector density and decreasing the criticality of conductor pad alignment. It is possible to route conductors in a multi-layer flexible circuitry (as shown in FIG. 4) and to further include ground planes (as will be discussed with respect to FIGS. 11 and 12) which terminate in a multi-row matrix using multiple layers and conductive vias through the layers.

The use of many types of flexible circuitry is within the scope of the invention. FIGS. 9–12 illustrate various important types of flexible circuitry that may be used to make a high-performance connector that is within the scope of the invention.

The high-performance connector illustrated in FIGS. 1–4 includes spring means 12 which may be described generally as an elongated hollow split tube having a longitudinal axis and an axially aligned split defining a generally C-shaped cross-section with end portions 30. The spring means is preferably a beryllium copper, although other materials providing suitable physical properties to bias the heat-recoverable member 14 are within the scope of the invention. The embodiment of FIGS. 1–4 also includes arm portions 32 connected to the end portions 30 of the C-shaped cross-section, the arm portions extending inwardly toward the axis of the split tube. Inward movement of the spring means will cause the arm portions 32 of the spring means 12 to move toward each other while simultaneously moving longitudinally inwardly toward the axis of the split tube. This movement will be discussed further as creating a wiping action.

FIG. 6 illustrates a high-performance connector having spring means 12A with alternative arm portions 32A. It can be seen that arm portions 32A are convoluted to concentrate force and contact area adjacent contact pads 26A of the set 20A of multiple conductors. Although two lines of contact and corresponding convolutions are illustrated, it is understood that it is within the scope of the invention to provide multiple convolutions to enhance pressure contact in the pad areas.

Figure 7:
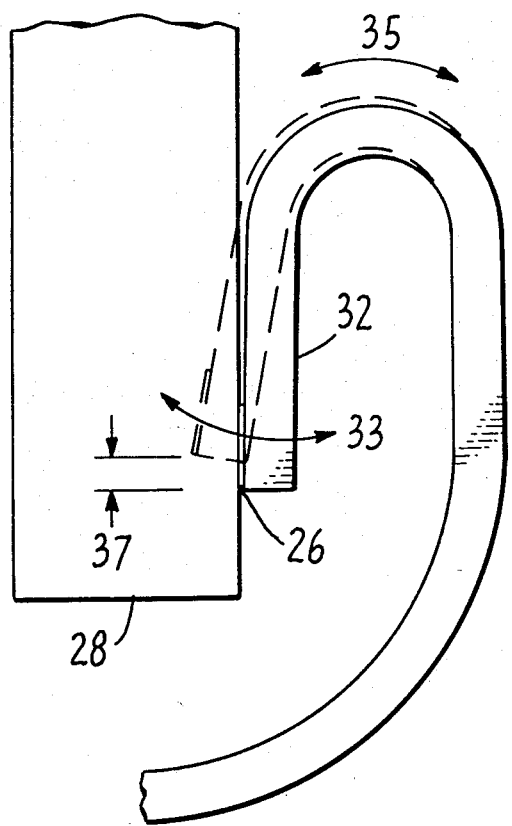
FIG. 7 is an enlarged partial view of the end portion of a spring means similar to that shown in FIGS. 1-6 that illustrates the generally parallel motion of contact pads upon closing of the connector causing a wiping action of the interface of the contact pads.

FIG. 7 shows the movement of a portion of the spring arm 32. As the spring arm closes along directional path 33 on the substrate 28, a downward wiping action is generated at the contact pad 26 simultaneous to the creation of high normal force contact. It can be seen that bending of the spring arm, as noted at 35, produces the generally parallel path motion of the contact pads toward each other to close the connector while simultaneously producing the vertical movement over the distance noted at 37 defined as the wiping action. The inward closing movement thus causes the pads of each matrix to move toward each other and at right angles thereto with respect to a substrate that may be inserted between the pads. The wiping action under high force helps break through contamination and oxides that may be present.

A heat-recoverable member 14, which is also elongated and generally C-shaped, is concentrically positioned within the cross-section of the spring means 12. The heat-recoverable member is formed from a shape-memory alloy having a deformable state below a transition temperature and a memory state above the transition temperature. The heat-recoverable member 14 is capable of being deformed by the spring means when the alloy is in its deformable state corresponding to one dimension of the split and is biased by the spring means. A change from its deformable state to its memory state recovers the heat-recoverable member to its non-deformed shape corresponding to another dimension of the split.

FIG. 8 discloses an alternate embodiment of a high-performance connector shown generally at 34. Connector 34 comprises a spring means 36 which may also be described as an elongated hollow split tube having a longitudinal axis and an axially aligned split defining a generally C-shaped cross-section with end portions 38. In this embodiment, the end portions 38 are provided with a pair of pressure pads 40 which are connected to the end portions. The pressure pads 40 provide broad surface areas to support the first matrix 42 and the second matrix 44 of the first and second sets of parallel spaced conductors 46 and 48 which are wrapped around the spring means 36. Although the first and second sets of parallel spaced conductors 46 and 48 are shown to be wrapped around the connector (similar to the embodiment shown in FIG. 5), it is understood that the sets of conductors 46 and 48 may exit the connector, as shown in FIG. 1.

The embodiment of FIG. 8 also includes a heat-recoverable member 50 which functions substantially identically to the heat-recoverable members described above.

The function of the pressure pad 40 is to provide parallel closing action without wiping movement on substrate 28. This action will allow the connector to conform to different substrate thicknesses. At higher contact densities and smaller pad size, the wiping action provided by the structures shown in FIGS. 1–6 will not be advantageous. The wiping action itself may cause misalignment.

FIGS. 5 and 8 illustrate the sets of parallel spaced conductors wrapped completely around the connector to provide a contact surface 56 on the bottom of the connector. In these alternate constructions, pressure applying means 52 is positioned external to the spring means to force the sets of parallel conductors to interconnect with a mother board 54, as seen in FIG. 5.

Pressure applying means 52 in FIGS. 5 and 8 may be made of a compliant material (such as a closed cell foam) or be formed from individual cantilever springs stamped into a spring material. The contacts may also be single point bonded or soldered to a substrate shown to be a mother board 54. This can be accomplished by windowing both sides to allow access for bonding.

The heat-recoverable members 14 and 36 described above are made from shape-memory alloy. Memory metals are alloys which manifest the shape-memory effect. Such alloys are well-known, and they and the shape-memory effect are discussed in, for example, "Shape-Memory Alloys" by L. McDonald Schetky, *Scientific American*, Vol. 281, November 1979, pp. 74–82.

Shape-memory alloys have been used for connectors, as described above, with regard to the earlier discussed commonly-assigned patent to Krumme. Generally, the material is a nickel-titanium alloy commonly called Nitinol, although copper-based alloys and other material based alloys are also useful. These shape-memory alloys are commonly called "memory metals". These alloys exhibit a martensitic transformation from a low temperature form to a high temperature form, and it is this transformation which produces the memory effect. These alloys are described in various publications including "55-Nitinol—The Alloy with a Memory: Its Physical Metallurgy, Properties, and Applications" by C. M. Jackson, H. J. Wagner and R. J. Wasilewski, NASA Publication SP5110, 1972, and "55-Nitinol—Unique Wire Alloy with a Memory" by William J. Buehler and William B. Cross, *Wire Journal*, June 1969. The copper-based alloys, sometimes described as "beta-brass alloys", that exhibit this property are described by N. Nakanishi et al., in scripta metallurgica 5,433-440 (Per Gamon Press, 1971).

The transition temperature for the shape-memory alloy may be varied, depending upon the metal and upon certain processing parameters. It is understood that the subject invention is not limited to a particular alloy or transition temperature. It is preferred, however, that the transition temperature be significantly above operating temperature to avoid accidental opening of the connector.

Although the heat-recoverable member may be raised in temperature by various means, including passing current through the shape-memory alloy or by including a resistance heater circuit in the flexible circuitry, it is preferred to use a separate heater means in the form of a resistance heater. Heater 60 is shown in FIG. 1 to be in thermal contact with heat-recoverable member 14. In FIG. 6, heater 62 is also provided.

The heater element 60 is placed between the beryllium copper spring 36 and the NiTi actuator 50 with separate electrical leads. The heater is preferably not a part of the signal carrying circuit. This isolates the heater and allows less heat to be transmitted to the flexible circuitry 20, 20a, 46 and 48 when opening the connector.

Figures 11A, 11D:
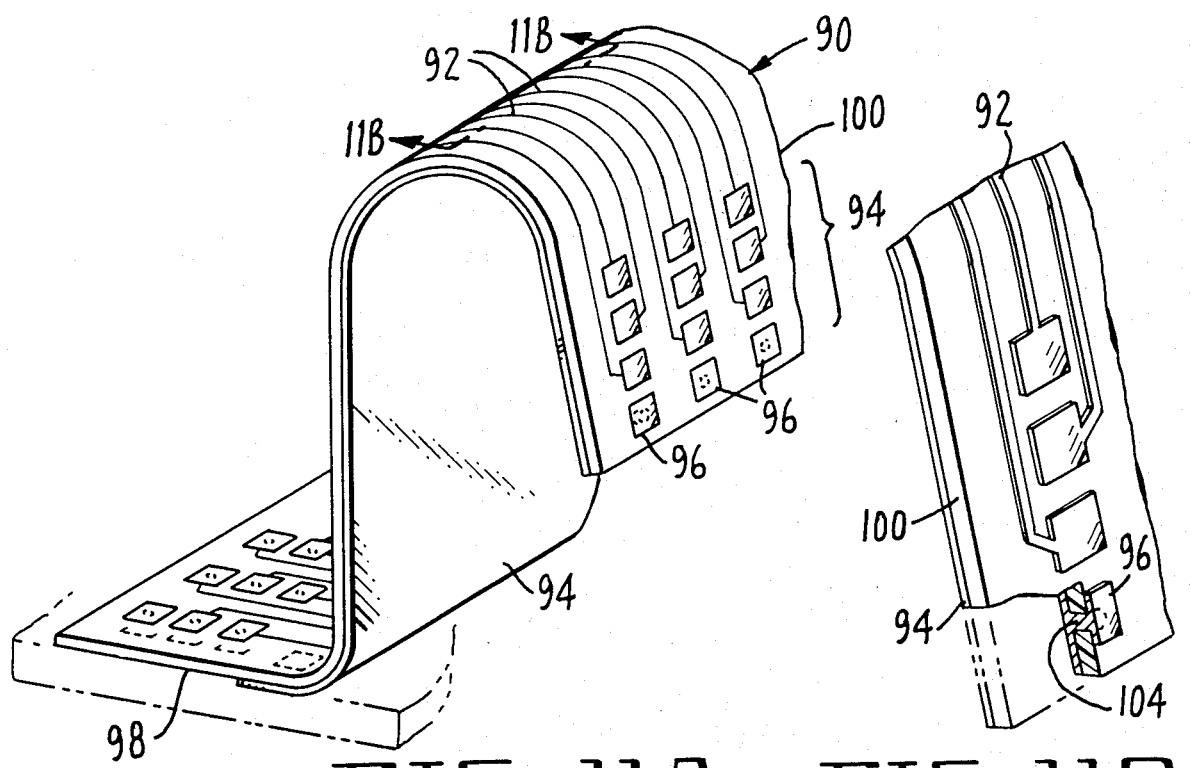
Figures 11C, 11E:
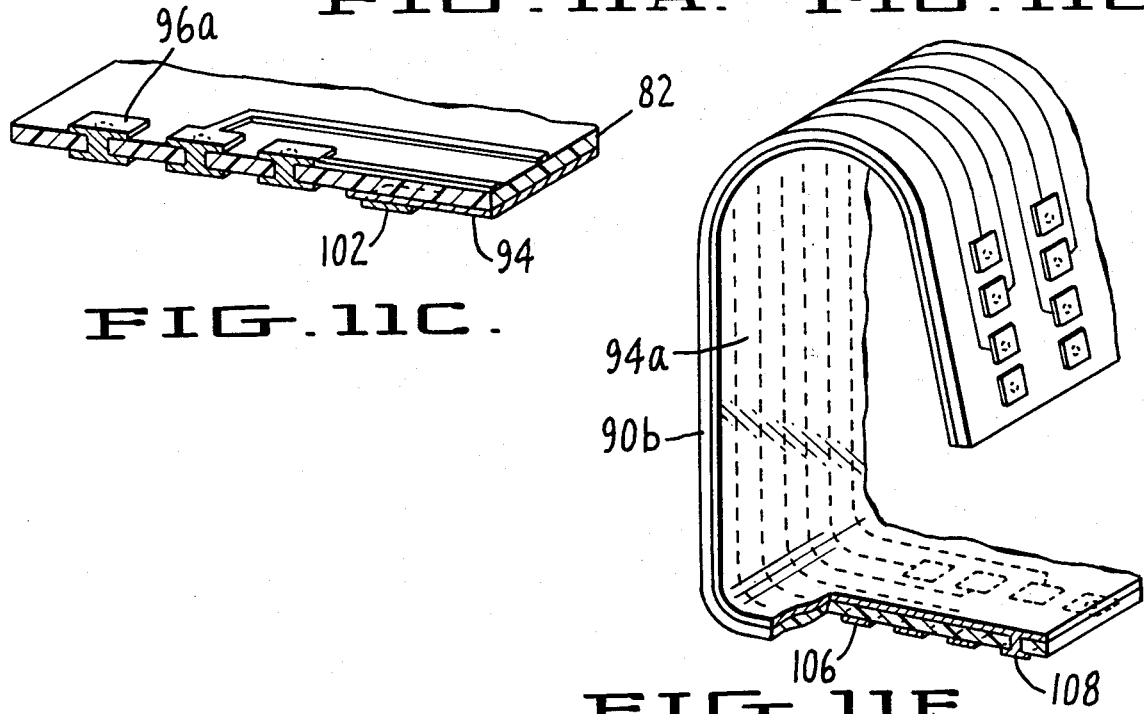
Figure 11B:
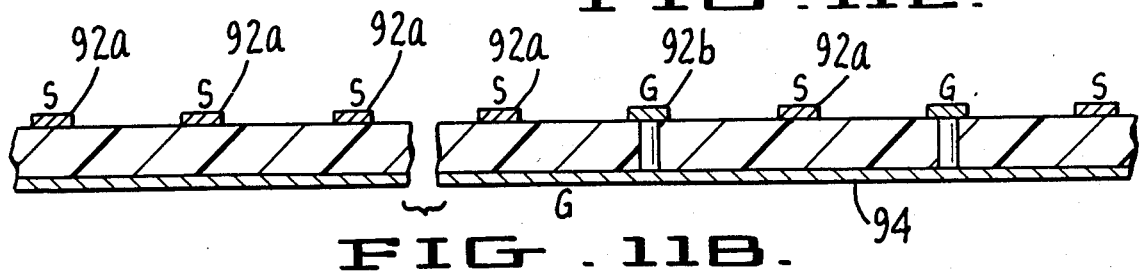

FIGS. 9, 11 and 12 disclose alternative forms of parallel spaced conductors wherein the conductors are a part of what is commonly called "flexible circuitry". FIGS. 9A–D disclose co-planar flexible circuitry wherein conductors are in a plane on the surface of a dielectric material. FIGS. 11A–E disclose a co-planar with ground plane flexible circuitry which include co-planar conductors and a common ground plane separated by a dielectric material. FIGS. 12A–C disclose strip-line flexible circuitry wherein conductors are insulated within a dielectric material and are sandwiched between a pair of ground planes.

Figure 9A:
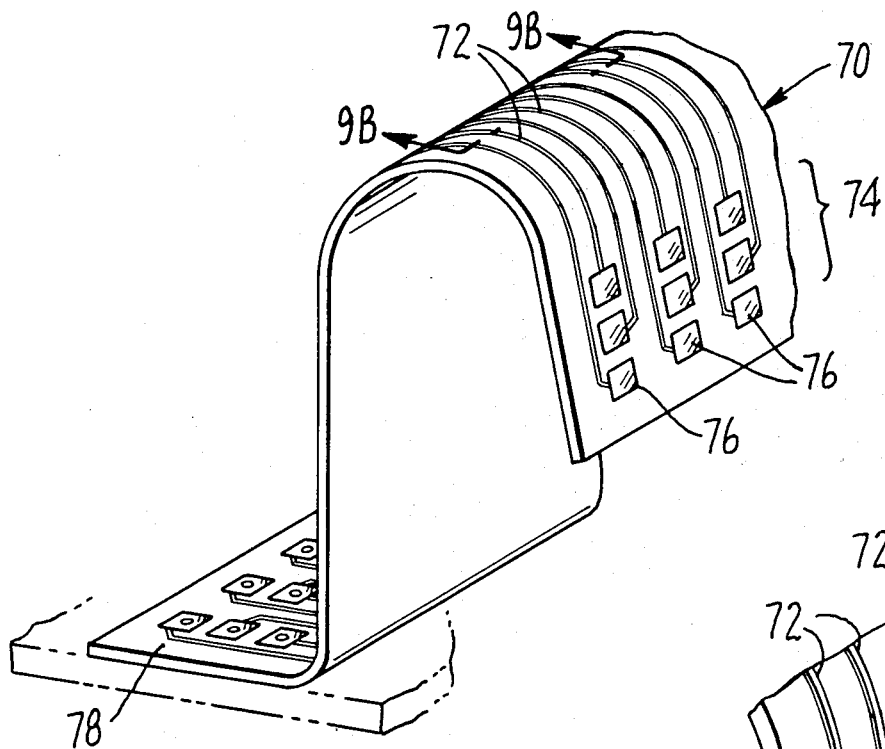

FIG. 9A discloses one set, shown generally at 70, of parallel spaced conductors 72 terminating at one end in a first matrix 74 of contact pads 76. It is understood that a second set (not shown) of parallel spaced conductors is symmetrically positioned with respect to the first set, as shown and discussed with regard to FIGS. 1-7. The first matrix 74 is positioned to contact a substrate, presumably a daughter board, as discussed earlier, and this portion of the set 70 will be referred to as the daughter board portion of the set.

Figure 9D:
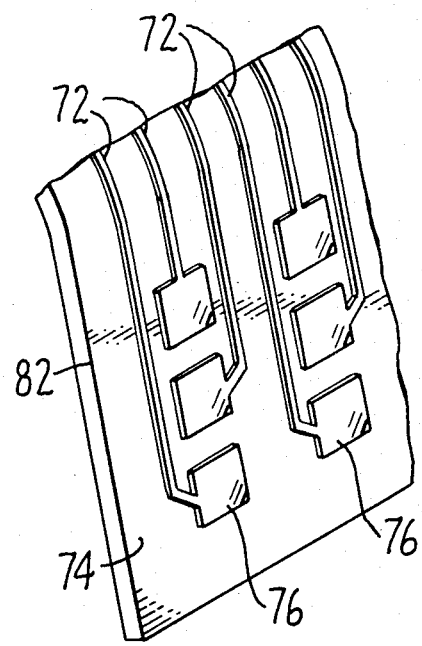
Figure 9C:
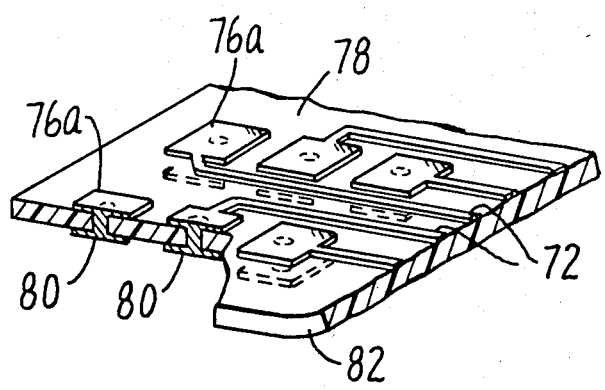

The other end of the set 70, the conductors 72, terminate in a third matrix 78 of contact pads 80, as can be seen more clearly in FIG. 9C. This portion of the set 70 preferably contacts a substrate in the form of a mother board (shown in phantom), and this portion of the set 70 is referred to as the mother board attachment portion of the set 70.

Figure 9B:
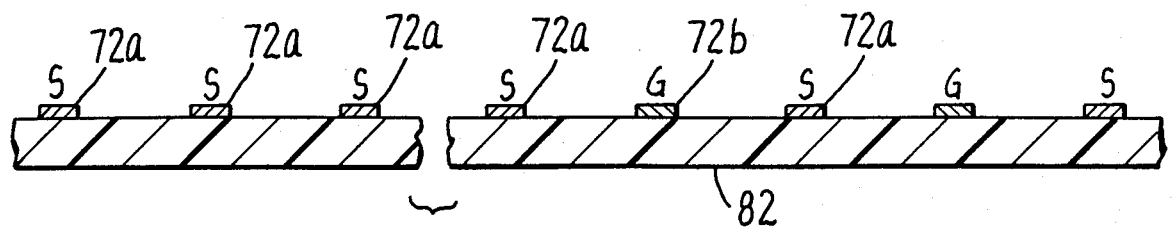

FIG. 9B discloses a cross-section of the set 70 and the conductors 72A and B. It can be seen that the conductors are all co-planar, the distinction being that conductors carrying a signal are noted as 72A, and conductors serving as ground means are designated as 72B. The two different circuit arrangements idealize the density of signal traces (in the case of the left portion of FIG. 9B) and idealize signal integrity (in the case of the right portion).

FIG. 9D is an enlargement of the mother board attachment portion 74 of the set 70. It can be seen that contact pads 76 are connected with conductor 72, the pads forming the first matrix 74. The conductors 72 run along the surface of dielectric material 82 to the point that they terminate on the surface of the dielectric material 82 at the daughter board portion of the set 70, as shown in FIG. 9C. Conductors 72 terminate in pads 76A on the surface of the dielectric material 82. In order to pass the signal through the dielectric material 82, various means are employed. As seen in FIG. 9C, through-hole portions 80 are created by perforating the dielectric material 82 and creating a post or a via through the dielectric material 82 to a pad portion on the opposite side thereof which will interface with a mother board.

Figure 10:
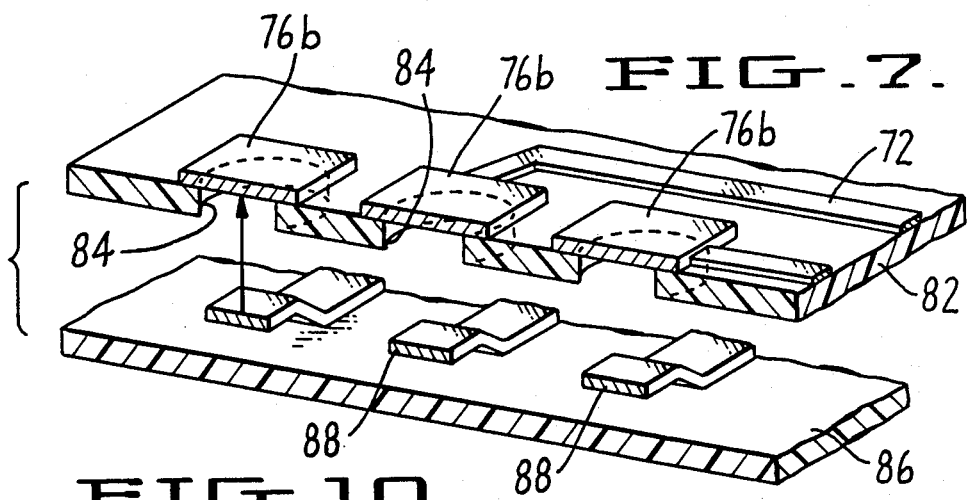
FIG. 10 is an enlarged partial perspective view similar to FIG. 9C of an alternate structure for terminating co-planar flexible circuitry wherein the insulated dielectric layer of the upper set of parallel spaced conductors is selectively removed exposing individual contacts which can be permanently interconnected to the lower set of contacts by pressing the sets together while heating the contacts to solder the contact pads by conventional solder-reflow or alternatively by thermosonic bonding of the pads of the contacts.

FIG. 10 illustrates an alternative means to electrically interconnect pads 76B with a mother board. In this embodiment, dielectric material 82 is perforated at 84, and the mother board 86 is provided with upstanding conductor portions 88 which will contact pads 76B when the layers are pressed together. Upstanding portions 88 are typically provided with a fusible material, such as solder, and when pressed against the bottom of pads 76B under temperature and pressure by known mass soldering methods will create a permanent connection between the mother board and the mother board portion of the flexible circuitry. The alternative disclosed in FIG. 10 is a means for permanently interconnecting the high-performance connector to a mother board. In contrast, the through-hole concept of FIG. 9C may be used for either a permanent or a temporary (as in pressure) connection. This type of pressure connection is that illustrated and previously discussed with respect to FIGS. 5 and 7 and as will be discussed with respect to FIG. 11E.

FIGS. 11A–E illustrate a first set, shown generally at 90, of parallel spaced conductors 92 and further including a ground plane 94. This embodiment of flexible circuitry has a first matrix 94 of contact pads 96 of flexible circuitry having a mother board attachment portion 98 and a daughter board portion 100. The conductors 92 in the mother board and daughter board portions of the set 90 are terminated as discussed with regard to FIGS. 9A–D. The ground plane 94, as seen in FIGS. 11A and 11C, is electrically interconnected to the mother board (shown in phantom) by pad 102. The ground plane preferably does not continue across the surface of the lower portion of the mother board portion of the set 90.

In the daughter board portion, as shown in FIG. 11D, the ground plane 94 does continue beneath the dielectric 82 and makes contact with a daughter board (not shown) by means of via 104.

FIG. 11B illustrates different forms of co-planar with ground plane flexible circuitry. In the portion to the left, the signal can be passed through every conductor 92A. This type of flexible circuitry is commonly known as "micro-strip" flexible circuitry. The portion of the flexible circuitry to the right illustrates co-planar with ground plane flexible circuitry wherein parallel spaced conductors are alternately grounded (as shown in phantom) to ground plane 94. These conductors are noted in 92B.

FIG. 11E illustrates an alternate embodiment of flexible circuitry, as shown in FIGS. 5 and 8, wherein the flexible circuitry or set 90B is wrapped around the connector to interface with the mother board. In this embodiment, the mother board portion 106 is substantially identical to the daughter board portion 100 shown in FIG. 11D. In this embodiment, the ground plane 94A is co-extensive with the contacts and extends as far as contact 108 to provide effective shielding along the entire surface of set 90.

FIGS. 12A-C disclose yet another embodiment of flexible circuitry wherein the set, shown generally at 110, of parallel spaced conductors 112, the set terminating in a first matrix 114 of contact pads 116. In this embodiment, the mother board portion 118 and the daughter board portion 120 are similar but are not identical. As seen in FIG. 12B, conductors 112 are sandwiched between ground planes 122 and 124.

As seen in FIG. 12C corresponding to the mother board portion of the set 110, the conductors 112 are electrically interconnectable with the surface through one of the dielectric layers 126 by through-hole or via 128. The ground planes are shown to be interconnected by via 130. Via 128 interconnects with pad 132 which is insulated from ground plane 124 by removal of a larger diameter of material in the vicinity of pad 132. This geometry allows contact from both the signal output and ground plane to a mother board or to a daughter board.

It is understood that it is within the scope of the invention to wrap the set 110 beneath the connector as previously discussed with respect to FIGS. 5, 8 and 11E.

From the foregoing detailed description, it is evident that there are a number of changes, adaptations and modifications of the present invention which come within the province of those skilled in the art. However, it is intended that all such variations not departing from the spirit of the invention be considered as being within the scope thereof and as being limited solely by the appended claims.

What is claimed is:
1. A high-performance connector comprising:
spring means, said spring means being an elongated hollow split tube having a longitudinal axis and an axially aligned split defining a generally C-shaped cross-section with end portions;
a heat-recoverable member, said heat-recoverable member being elongated and generally C-shaped and being concentrically positioned within the cross-section of said spring means and being biased by said spring means, said heat-recoverable member formed from shape-memory alloy having a deformable state below a transition temperature and a memory state above the transition temperature, said heat-recoverable member capable of being deformed by said spring means when said alloy is in its deformable state corresponding to one dimension of said split, a change from its deformable state to its memory state recovering said member to its non-deformed shape corresponding to another dimension of said split; and
first and second sets of parallel spaced conductors, each set terminating at one end of each set thereof in a first and a second matrix of contact pads, respectively, the contact pads of each matrix being spaced from each other in that matrix in two dimensions, said first and second sets of conductors at least partially surrounding said spring means and said matrices being positioned within the split of said spring means adjacent the end portions of said spring means, pads of the first matrix being positioned on one side of the split and the pads of the second matrix being positioned generally opposite thereto on the other side of the split, movement of said spring means causing the plurality of pads on each matrix to move toward each other to contact and electrically connect with a substrate that may be inserted within said split.

2. A high-performance connector as in claim 1 further including a pair of pressure pads connected to the end portions of the C-shaped cross-section of the spring means, said pressure pads providing broad surface areas to support the first and second matrices of the contact pads.

3. A high-performance connector as in claim 2 further including heater means positioned adjacent the heat-recoverable member between the heat-recoverable member and the spring means.

4. A high-performance connector as in claim 2 wherein the contact pads are raised relative to the surface of the matrix to enhance contact between the pads and the substrate that may be inserted within said split.

5. A high-performance connector as in claim 2 wherein said parallel spaced conductors are co-planar.

6. A high-performance connector as in claim 2 wherein the flexible circuitry includes a ground plane defining micro-strip flexible circuitry.

7. A high-performance connector as in claim 2 wherein the flexible circuitry includes a ground plane and wherein the parallel spaced conductors are alternately grounded to said plane defining co-planar with ground plane flexible circuitry.

8. A high-performance connector as in claim 2 wherein the flexible circuitry includes a pair of ground planes, said conductors being insulated from and sandwiched between said ground planes, said circuitry defining strip-line flexible circuitry.

9. A high-performance connector as in claim 2 wherein the flexible circuitry is a combination of two or more types of flexible circuitry.

10. A high-performance connector as in claim 1 wherein said first and second sets of conductors generally surround the spring means and further including pressure applying means positioned between said spring means and said first and second sets of conductors to interconnect the high-performance connector to a mother board.

11. A high-performance connector as in claim 1 further including arm portions connected to the end portions of the C-shaped cross-section of the spring means, the arm portions extending inwardly toward the axis of the split tube, inward closing movement of said spring means causing the arms of said spring means to move toward each other and radially inwardly toward the axis of the spring means causing the plurality of pads of each matrix to move toward each other and at right angles thereto with respect to a substrate that may be inserted between said pads causing a wiping action with such a substrate.

12. A high-performance connector as in claim 11 wherein the contact pads are raised relative to the surface of the matrix to enhance contact between the pads and the substrate that may be inserted within said split.

13. A high-performance connector as in claim 11 further including heater means positioned adjacent the heat-recoverable member between the heat-recoverable member and the spring means.

14. A high-performance connector as in claim 11 wherein said parallel spaced conductors are a part of flexible circuitry.

15. A high-performance connector as in claim 11 wherein the flexible circuitry is co-planar flexible circuitry.

16. A high-performance connector as in claim 11 wherein the flexible circuitry includes a ground plane defining micro-strip flexible circuitry.

17. A high-performance connector as in claim 11 wherein the flexible circuitry includes a ground plane and wherein the parallel spaced conductors are alternately grounded to said plane defining co-planar with ground plane flexible circuitry.

18. A high-performance connector as in claim 11 wherein the flexible circuitry includes a pair of ground planes, said conductors being insulated from and sandwiched between said ground planes, said circuitry defining strip-line flexible circuitry.

19. A high-performance connector as in claim 11 wherein the flexible circuitry is a combination of two or more types of flexible circuitry.

20. A high-performance connector as in claim 11 wherein said first and second sets of conductors generally surround the spring means and further including pressure applying means positioned between said spring means and the first and second sets of conductors to interconnect the high-performance connector to a mother board.

* * * * *